(12) United States Patent
Kumar et al.

(10) Patent No.: US 8,367,463 B2
(45) Date of Patent: Feb. 5, 2013

(54) METHODS FOR FORMING RESISTIVE-SWITCHING METAL OXIDES FOR NONVOLATILE MEMORY ELEMENTS

(75) Inventors: Pragati Kumar, Santa Clara, CA (US); Sandra G. Malhotra, San Jose, CA (US); Sean Barstow, San Jose, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/111,230

(22) Filed: May 19, 2011

(65) Prior Publication Data

US 2012/0149164 A1 Jun. 14, 2012

Related U.S. Application Data

(62) Division of application No. 12/967,530, filed on Dec. 14, 2010, now Pat. No. 7,977,153.

(51) Int. Cl.
*H01L 21/00* (2006.01)
*H01L 21/16* (2006.01)
*H01L 21/20* (2006.01)
*H01L 21/36* (2006.01)

(52) U.S. Cl. ............... 438/104; 438/678; 257/E21.078; 257/E21.158

(58) Field of Classification Search ..................... None
See application file for complete search history.

(56) References Cited

U.S. PATENT DOCUMENTS 7,863,087 B1 * 1/2011 Kumar et al. ............... 438/104

* cited by examiner

*Primary Examiner* — Seahvosh Nikmanesh

(57) ABSTRACT

Nonvolatile memory elements are provided that have resistive switching metal oxides. The nonvolatile memory elements may be formed from resistive-switching metal oxide layers. Metal oxide layers may be formed using sputter deposition at relatively low sputtering powers, relatively low duty cycles, and relatively high sputtering gas pressures. Dopants may be incorporated into a base oxide layer at an atomic concentration that is less than the solubility limit of the dopant in the base oxide. At least one oxidation state of the metal in the base oxide is preferably different than at least one oxidation sate of the dopant. The ionic radius of the dopant and the ionic radius of the metal may be selected to be close to each other. Annealing and oxidation operations may be performed on the resistive switching metal oxides. Bistable metal oxides with relatively large resistivities and large high-state-to-low state resistivity ratios may be produced.

10 Claims, 11 Drawing Sheets

| Power | Resistivity |
|---|---|
| 100W | 1.01 ohm-cm |
| 150W | 1.36E-01 ohm-cm |
| 300W | 1.93E-04 ohm-cm |

FIG. 8

| SAMPLE NUMBER | DUTY CYCLE (%) | THICKNESS (Å) | $R_s$ (ohm/sq) | RESISTIVITY (ohm/cm) |
|---|---|---|---|---|
| 1 | 0 (DC) | 434 | 50100 | 0.22 |
| 2 | 10 | 548 | 34900 | 0.19 |
| 3 | 15 | 569 | 22800 | 0.13 |
| 4 | 20 | 478 | 18400 | 0.09 |

FIG. 9

| SAMPLE NUMBER | PROCESS | Rs (ohm/sq) | THICKNESS (Å) |
|---|---|---|---|
| 1 | 300W PULSED DC 20S, 5mT 38% $O_2$, 300°C | 59.4 (AS DEPOSITED) OFF LIMIT (RTO) | 281 |
| 2 | 300W DC 20S, 5mT 38% $O_2$, 300°C | 136.5 (AS DEPOSITED) OFF LIMIT (RTO) | 251 |
| 3 | 300W PULSED DC 20S, 60mT 47% $O_2$, 300°C | 2147000 (AS DEPOSITED) OFF LIMIT (RTO) | 118 |
| 4 | 300W DC 20S, 60mT 47% $O_2$, 300°C | OFF LIMIT (AS DEPOSITED) OFF LIMIT (RTO) | 97 |

FIG. 10

| Alloy | Resistivity |
|---|---|
| NiO | 0.14 ohm-cm |
| (Ni3.0Ti)O | 0.76 ohm-cm |
| (Ni3.0Co)O | 0.41 ohm-cm |
| (Ni3.0V)O | 0.36 ohm-cm |
| (Ni3.0Nb)O | 0.79 ohm-cm |

FIG. 12

| Substrate Temperature (°C) | Film Resistivity (ohm-cm) |
|---|---|
| 100 | 1.30E-02 |
| 300 | 8.30E-02 |

FIG. 13

| | Resistivity (ohm-cm) | |
|---|---|---|
| O2% | 5mT | 40mT |
| 47.4 | 0.087271 | 0.121768 |
| 50.0 | 0.083183 | 0.49152 |
| 58.3 | 0.067640 | 3.45814 |
| 66.7 | 0.064940 | 5.44512 |
| NiO Process - 150W, 150kHz, 300C | | |

FIG. 15

| | Resistivity (ohm-cm) | |
|---|---|---|
| O2% | 5mT | 20mT |
| 33.3 | 0.190284 | 1.3776 |
| 37.5 | 0.13364 | 0.5724 |
| 41.2 | 0.14673 | 1.02982 |
| 44.4 | 0.149526 | 2.6568 |
| NiO Process - 150W, 150kHz, 300C | | |

FIG. 14

METHODS FOR FORMING RESISTIVE-SWITCHING METAL OXIDES FOR NONVOLATILE MEMORY ELEMENTS

CROSS REFERENCE TO RELATED APPLICATIONS

This application is a divisional application of U.S. patent application Ser. No. 12/967,530, filed Dec. 14, 2010. The present application claims priority under 35 U.S.C. §120 to U.S. patent application Ser. No. 12/114,655, filed May 2, 2008. Said U.S. patent application Ser. No. 12/114,655, filed May 2, 2008 claims priority under 35 U.S.C. §119 to U.S. Provisional Application Ser. No. 60/928,548, filed May 9, 2007. Said U.S. patent application Ser. No. 12/114,655, filed May 2, 2008 and U.S. Provisional Application Ser. No. 60/928,548, filed May 9, 2007 are hereby incorporated by reference herein in their entirety.

BACKGROUND

This invention relates to nonvolatile memory elements, and more particularly, to methods for forming resistive switching memory elements for nonvolatile memory elements.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly small dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on nickel oxide switching elements and other transition metal oxide switching elements has been demonstrated. Although metal oxide (MO) films such as these exhibit bistability, the resistance of these films and/or the ratio of the high-to-low resistance states is (are) often insufficient to be of use within a practical nonvolatile memory device. For instance, the resistance states of the metal oxide film should preferably be significant as compared to that of the system (e.g., the memory device and associated circuitry) so that any change in the resistance state change is perceptible. This makes it difficult to integrate lower resistance metal oxide films into practical nonvolatile memory devices. For example, in a nonvolatile memory that has conductive lines formed of a relatively high resistance metal such as tungsten, the resistance of the conductive lines may overwhelm the resistance of the metal oxide resistive switching element. This may make it difficult or impossible to sense the state of the bistable metal oxide resistive switching element. Similar issues can arise from integration of the resistive switching memory element with current steering elements such as diodes and/or resistors. The resistance of the resistive switching memory element (at least in its high resistance state) is preferably significant compared to the resistance of the current steering elements so that any change in the resistance state of the resistive switching memory element can be detected reliably.

It would therefore be desirable to be able to form highly resistive metal oxide films and to be able to tailor the resistances of such films for nonvolatile memory elements.

SUMMARY

In accordance with the present invention, nonvolatile memory elements and methods of fabrication are provided. The nonvolatile memory elements may have resistive-switching metal oxide layers. Stacked nonvolatile memory element arrangements and nonvolatile memory elements with resistive-switching metal oxides that are connected in series with current steering elements such as diodes and transistors may also be provided.

The nonvolatile memory elements may be formed from bistable metal oxides. In a typical scenario, a layer of metal oxide is deposited between conductive layers that serve as memory element electrodes.

Process parameters may be selected to ensure that the resistivity of the metal oxide and the ratio of the oxide's high-state to low-state resistances are relatively high. This ensures that the resistance changes exhibited by the metal oxide layers in the nonvolatile memory elements will not be overwhelmed by the resistance of routing lines and other components (e.g. resistors, current steering elements, etc.) in a nonvolatile memory.

With one suitable arrangement, metal oxide films are sputter deposited using a magnetron (i.e. sputtering source) at a relatively low sputtering power density (e.g., below 6 $W/cm^2$). A relatively high sputtering gas pressure (e.g., above 10 mTorr) may be used during the metal oxide deposition process to increase film resistivity in another embodiment. DC power pulses for the magnetron may have a relatively low duty cycle (e.g., below 30%) in the case of pulsed-DC sputtering in one embodiment. Rapid thermal anneal and oxidation steps may be used to further improve film resistivity (resistance) in another embodiment.

Dopants may be incorporated into the metal oxide to increase film resistivity in one embodiment. In one embodiment, the dopant is chosen to be aliovalent wherein at least one oxidation state of the dopant is different from the oxidation state of the metal in the base oxide. The ionic radius of the dopant and the ionic radius of the metal may be selected to be close to each other. Dopants may be incorporated into a base metal oxide at an atomic concentration that is less than or equal to the solubility limit of the dopant in the base oxide.

A combination of the aforementioned process parameters, processes, and post processing can also be used to tailor (e.g. increase) the deposited metal oxide film resistivity (i.e. resistance of the resistance switching memory element).

Further features of the invention, its nature and various advantages will be more apparent from the accompanying drawings and the following detailed description.

BRIEF DESCRIPTION OF THE DRAWINGS

FIG. 8 is a table showing the effect of changes in sputtering power on the measured resistivity of a resistive switching metal oxide in accordance with an embodiment of the present invention.

FIG. 9 is a table showing the effect of sputtering pulse duty cycle on the measured resistivity of a resistive switching metal oxide in accordance with an embodiment of the present invention.

FIG. 10 is a table showing the effect of performing rapid thermal oxidation operations on deposited resistive switching metal oxides in accordance with an embodiment of the present invention.

FIG. 12 is a table showing how doped resistive switching metal oxides may exhibit enhanced resistivities relative to undoped resistive switching metal oxides in accordance with an embodiment of the present invention.

FIG. 13 is a table showing the effect of substrate temperature on the measured resistivity of deposited metal oxide films in accordance with an embodiment of the present invention.

FIGS. 14 and 15 are tables showing how increased deposition pressures may enhance measured film resistivities for deposited metal oxides in accordance with an embodiment of the present invention.

DETAILED DESCRIPTION

Embodiments of the present invention relate to nonvolatile memory formed from resistive switching elements. Embodiments of the invention also relate to fabrication methods that may be used to form nonvolatile memory having resistive switching memory elements.

Resistive switching elements may be formed on any suitable type of integrated circuit. Most typically, resistive switching memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

Figure 1:
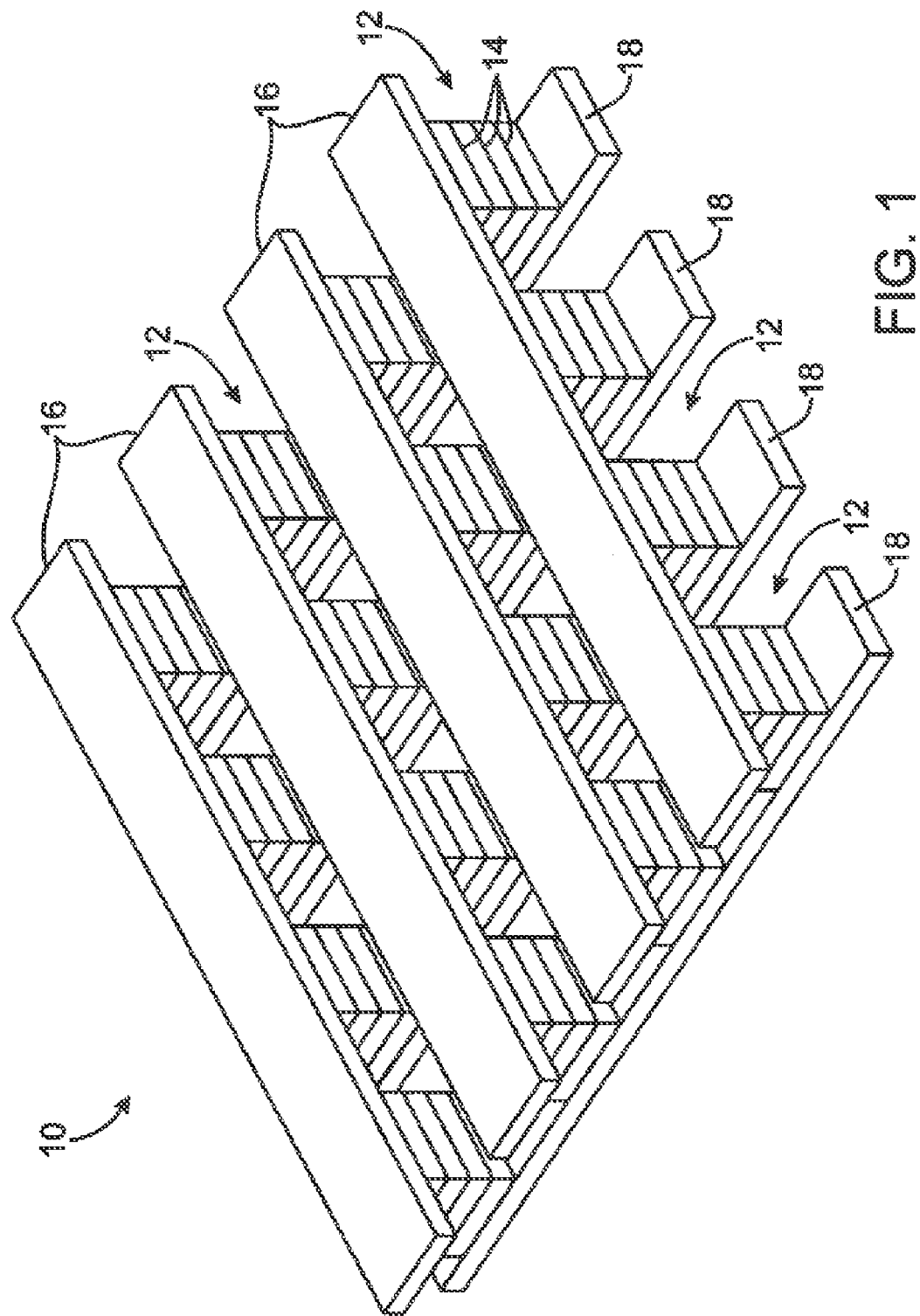
FIG. 1 is a diagram of an illustrative array of resistive switching memory elements in accordance with an embodiment of the present invention.

An illustrative memory array 10 of nonvolatile resistive switching memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18. Memory elements 12 may be formed from one or more layers of materials, as indicated schematically by lines 14 in FIG. 1. In addition, memory arrays such as memory array 10 can be stacked in a vertical fashion to make multilayer memory array structures.

During a read operation, the state of a memory element 12 can be sensed by applying a sensing voltage to an appropriate set of conductors 16 and 18. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

Figure 2A:
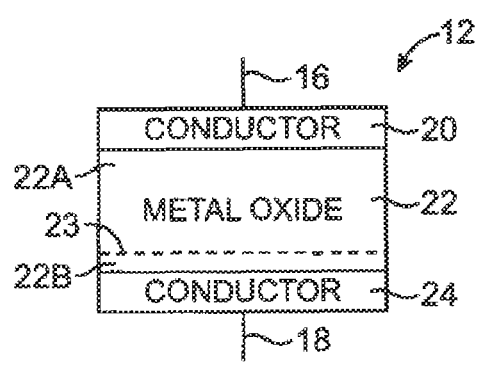
FIG. 2A is a cross-sectional view of an illustrative resistive switching nonvolatile memory element in accordance with an embodiment of the present invention.

A cross-section of an illustrative embodiment of a resistive switching memory element is shown in FIG. 2A. In the example of FIG. 2A, memory element 12 is formed from a metal oxide 22 and has conductive electrodes 20 and 24. When constructed as part of an array such as array 10 of FIG. 1, conductive lines such as lines 16 and 18 may be physically and electrically connected to electrodes 20 and 24. Such conductive lines may be formed from any suitable metals (e.g., tungsten, aluminum, copper, metal silicides, etc.). Conductive lines 16 and 18 may also be formed from other conductive materials (e.g., doped polysilicon, doped silicon, etc.) or combinations of conductive materials. If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., diodes, p-i-n diodes, silicon diodes, silicon p-i-n diodes, transistors, etc.) that are formed between line 16 and electrode 20 or between line 18 and electrode 24.

Metal oxide layer 22 may be formed from a single layer of material or from multiple sublayers of material. As shown by dotted line 23, for example, metal oxide 22 may be formed from metal oxide sublayer 22A and metal oxide sublayer 22B. There may, in general, be any suitable number of sublayers in metal oxide 22 (e.g., three or more sublayers, four or more sublayers, etc.). The depiction of two sublayers in FIG. 2A is merely illustrative.

Each sublayer in metal oxide 22 may be formed using a different fabrication process and/or different materials. For example, sublayer 22B may be formed by sputter deposition of material at one sputtering gas pressure (e.g., 10-50 mTorr), whereas sublayer 22A may be formed by sputter deposition of material at another sputtering gas pressure (e.g., 5 mTorr). Process parameters such as sputtering power, gas pressure, material composition, and temperature may be varied between sublayers. Sublayers such as sublayers 22A and 22B may have any suitable thicknesses. For example, sublayers 22A and 22B may have layer thicknesses of 10-150 angstroms, 10-250 angstroms, 5-2000 angstroms, etc.

Figure 2B:
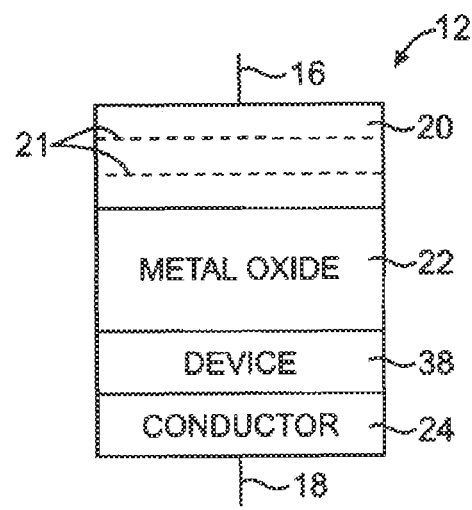
FIG. 2B is a cross-sectional view of an illustrative resistive switching nonvolatile memory element in accordance with another embodiment of the present invention.

If desired, there may be a series-connected electrical component between an electrode conductor and the resistive switching metal oxide. An illustrative arrangement in which there is an intervening electrical component 38 between conductor 24 and metal oxide 22 is shown in FIG. 2B.

As indicated schematically by dotted lines 21, conductive materials such as electrodes 24 and 20 may be formed from one or more layers of materials. Examples of materials that may be used to form electrodes 20 and 24 include metal (e.g., refractory or transition metals), metal alloys, metal nitrides (e.g., refractory metal nitrides, $Ti_{1-x}Al_xN_y$, $Ta_{1-x}Al_xN_y$, etc.), metal silicon nitrides (i.e., materials containing refractory metals, transition metals, or other metals, along with silicon and nitrogen), metal silicides, or other conductors.

Metal oxide 22 may be formed from a metal oxide such as a transition metal oxide (e.g., nickel-based oxide, cobalt-based oxide, copper-based oxide, titanium-based oxide, zirconium-based oxide, hafnium-based oxide, vanadium-based oxide, niobium-based oxide, tantalum-based oxide, etc.) or from other metal oxides such as aluminum oxide. One or more dopants may be incorporated into metal oxide 22. Examples of dopants that may be incorporated into metal oxide 22 include Al, Ti, Co, Zr, V, and Nb which are chosen based upon the base metal oxide 22 system.

Resistive switching memory element 12 exhibits a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry may apply suitable control signals to suitable lines 16 and 18.

By proper selection of the process parameters used to fabricate metal oxide 22, a resistive switching metal oxide may be formed that exhibits a relatively large resistance. For example, metal oxide 22 in device 12 may exhibit a high-state resistivity of at least one ohm-cm, at least ten ohm-cm, or 100 ohm-cm or more. The ratio of the high-state resistance of element 12 to the low-state resistance of element 12 may be greater than five or ten (as an example). It is generally desirable to have the ratio of the high-state resistance of element 12 to the low-state resistance of element 12 to be greater than or equal to ten and more preferably, greater than or equal to one hundred to facilitate clearly defined memory states.

Figure 3:
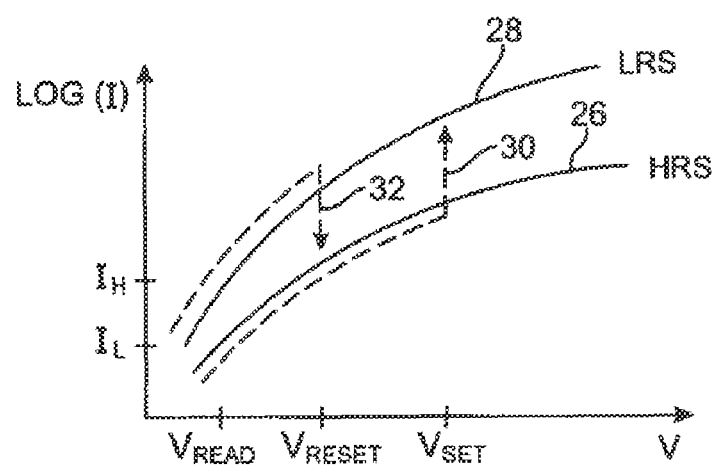
FIG. 3 is a graph showing how resistive switching nonvolatile memory elements of the types shown in FIGS. 2A and 2B may exhibit bistable behavior in accordance with an embodiment of the present invention.

A current (I) versus voltage (V) plot for device 12 is shown in FIG. 3. Initially, device 12 may be in a high resistance state (e.g., storing a logic one). In this state, the current versus voltage characteristic of device 12 is represented by solid line HRS 26. The high resistance state of device 12 can be sensed by read and write circuitry associated with an array of devices 12. For example, read and write circuitry may apply a read voltage $V_{READ}$ to device 12 and can sense the resulting low current $I_L$ that flows through device 12. When it is desired to store a logic zero in device 12, device 12 can be placed into its low-resistance state. This may be accomplished by using read and write circuitry to apply a voltage $V_{SET}$ across terminals 16 and 18 of device 12. Applying $V_{SET}$ to device 12 causes device 12 to enter its low resistance state, as indicated by dotted line 30. In this region, the structure of device 12 is changed (e.g., through the formation of current filaments through metal oxide 22 or other suitable mechanisms), so that, following removal of the voltage $V_{SET}$, device 12 is characterized by low resistance curve LRS 28.

The low resistance state of device 12 can be sensed using the read and write circuitry. When a read voltage $V_{READ}$ is applied to resistive switching memory element 12, the read and write circuitry will sense the relatively high current value $I_H$, indicating that device 12 is in its low resistance state. When it is desired to store a logic one in device 12, device 12 can once again be placed in its high resistance state by applying a voltage $V_{RESET}$ to device 12. When the read and write circuitry applies $V_{RESET}$ to device 12, device 12 enters its high resistance state HRS, as indicated by dotted line 32. When the voltage $V_{RESET}$ is removed from device 12, device 12 will once again be characterized by high resistance line HRS 26.

The bistable resistance of resistive switching memory element 12 makes memory element 12 suitable for storing digital data. Because no changes take place in the stored data in the absence of application of the voltages $V_{SET}$ and $V_{RESET}$, memory formed from elements such as element 12 is non-volatile.

Any suitable read and write circuitry and array layout scheme may be used to construct a nonvolatile memory device from resistive switching memory elements such as element 12. For example, horizontal and vertical lines 16 and 18 may be connected directly to the terminals of resistive switching memory elements 12. This is merely illustrative. If desired, other electrical devices may be associated with each element 12.

Figure 4:
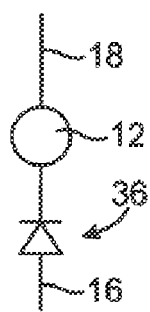
FIG. 4 is a schematic diagram of an illustrative resistive switching memory element in series with a diode in accordance with an embodiment of the present invention.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

Figure 5:
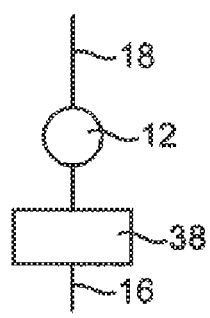
FIG. 5 is a schematic diagram of an illustrative resistive switching memory element in series with an electrical device in accordance with an embodiment of the present invention.
Figure 6:
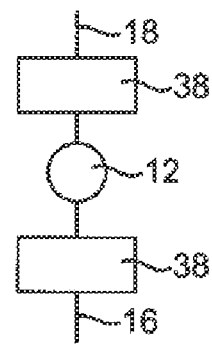
FIG. 6 is a schematic diagram of an illustrative resistive switching memory element in series with two electrical devices in accordance with an embodiment of the present invention.

If desired, other electrical components can be formed in series with resistive switching memory element 12. As shown in FIG. 5, series-connected electrical device 38 may be coupled to resistive switching memory element 12. Device 38 may be a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12. Electrical devices 38 may be formed as part of a nonvolatile memory element or may be formed as separate devices at potentially remote locations relative to a resistive switching metal oxide and its associated electrodes.

Memory elements 12 may be fabricated in a single layer in array 10 or may be fabricated in multiple layers forming a three-dimensional stack. An advantage of forming memory arrays such as memory array 10 of FIG. 1 using a multilayer memory element scheme is that this type of approach allows memory element density to be maximized for a given chip size.

If desired, a resistive switching metal oxide layer may be formed above or below a current steering element such as a diode. Conductive lines 16 and 18 may be electrically coupled to metal oxide 22 through a number of layers of conductive material. There may, in general, be any suitable number of conductive layers associated with resistive switching memory element 12. These conductive layers may be used for functions such as adhesion promotion, seed layers for subsequent electrochemical deposition, diffusion barriers to prevent undesired materials from diffusing into adjacent structures, contact materials (e.g., metals, metal alloys, metal nitrides, etc.) for forming ohmic contacts with the metal oxide 22, contact materials (e.g., metals, metal alloys, metal nitrides, etc.) for forming Schottky contacts to the metal oxide 22, etc.

The conductive layers in element 12 may be formed from the same conductive material or different conductive materials. For example, a conductive layer in element 12 may include two nickel layers or may contain a nickel layer and a titanium nitride layer (as an example). Moreover, conductive layers in element 12 may be formed using the same techniques or different techniques. As an example, a conductive layer may include a metal layer formed using physical vapor deposition (PVD) techniques (e.g., sputter deposition) and a metal layer formed using electrochemical deposition techniques.

The portions of the conductive layers in element 12 that are immediately adjacent to metal oxide 22 or are otherwise in close association with metal oxide 22 are sometimes referred to as the electrodes of the resistive switching memory element 12.

In general, the electrodes of resistive switching memory element 12 may each include a single material, may each include multiple materials, may include materials formed using a single technique or a series of different techniques, or may include combinations of such materials.

Certain metals are particularly appropriate for forming metal oxide 22. These metals may include, for example, the transition metals and their alloys, and other metals such as Al. Examples of transition metals that may be used in forming metal oxide 22 include Co, Ni, Cu, Ti, Zr, Hf, V, Nb, Ta, Cr, Mo, and W.

With one particularly suitable arrangement, the metals for forming metal oxide 22 include nickel. The metal oxide 22 may include other elements in addition to nickel. For example, metal oxide 22 may be formed from a metal such as nickel that has been doped with a dopant material such as titanium. In this situation, metal oxide 22 will contain nickel, titanium, and oxygen.

Other dopant materials that may be used include Al, Ti, Co, Zr, V, and Nb (as examples) depending on the base metal oxide 22 system.

Any suitable conductive materials may be used for forming the electrodes 20 and 24 of resistive switching memory element 12. Illustrative conductive materials include transition metals (and their nitrides), refractory metals (and their nitrides, including $Ti_{1-x}Al_xN_y$, $Ta_{1-x}Al_xN_y$, etc.), and noble metals. Illustrative examples of metals that may be used as conductive materials include Ni, Ti, Co, Cu, Ta, W, Mo, Ir, Ru, and Pt. These are merely illustrative examples of materials that may be used. Combinations of two or more of these metals may be used or other suitable conductive materials may be used as electrodes 20 and 24, if desired.

The layers of material that are formed when fabricating elements 12 may be deposited using any suitable techniques. Illustrative deposition techniques include physical vapor deposition (e.g., sputter deposition or evaporation), chemical vapor deposition, atomic layer deposition, electrochemical deposition (e.g., electroless deposition or electroplating), ion implantation (e.g., ion implantation followed by annealing operations), thermal oxidation, etc. When appropriate process parameters are used in forming the layers of elements 12 such as metal oxide layer 22, a bistable memory element with a suitably large resistance and a satisfactorily large difference between its high-state resistance and low-state resistance may be formed.

Figure 7:
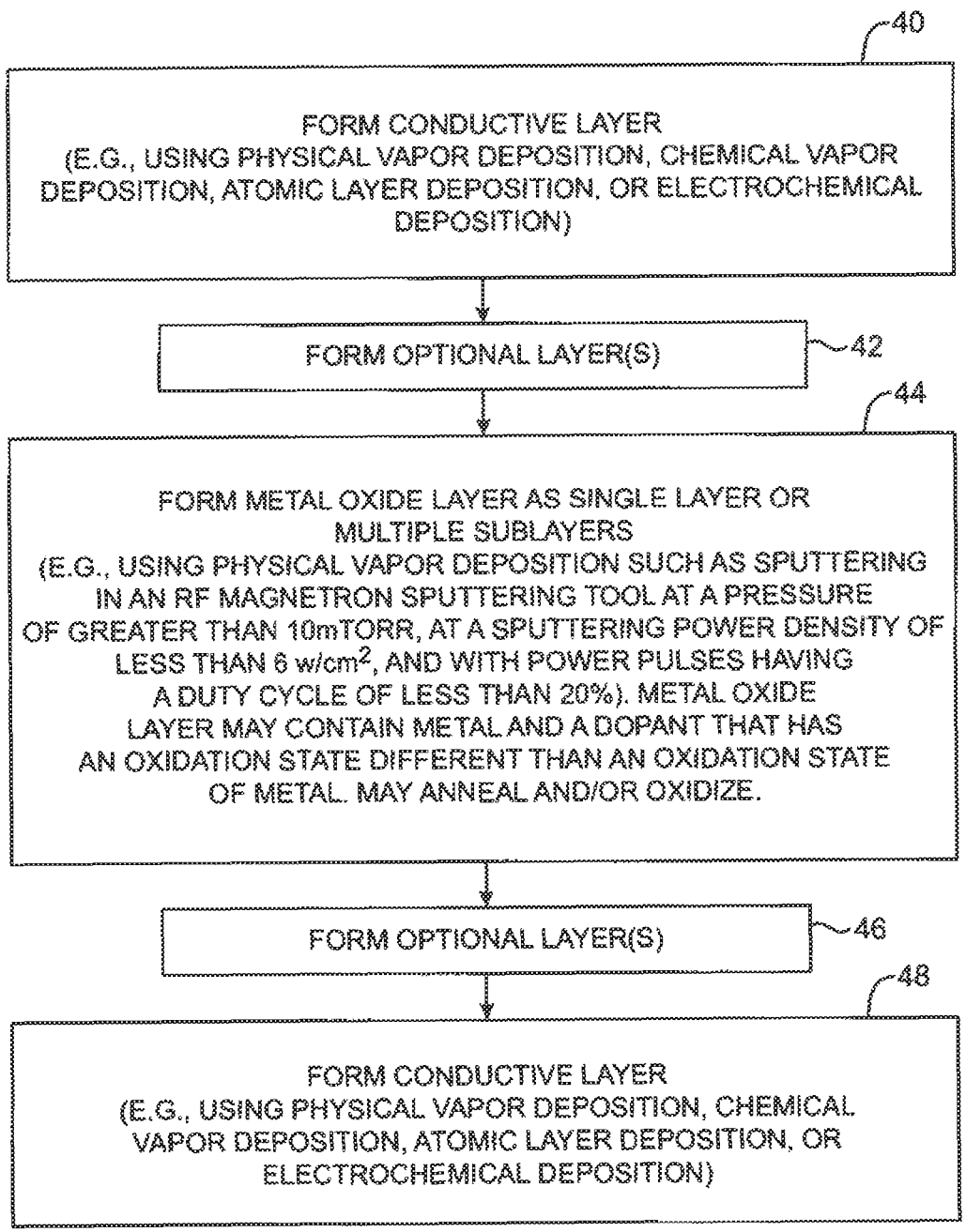
FIG. 7 is a flow chart of illustrative steps involved in forming resistive switching memory elements for nonvolatile memory devices in accordance with an embodiment of the present invention.

A typical fabrication process is shown in FIG. 7. At step 40, a first conductive layer such as conductive layer 24 of FIGS. 2A and 2B may be formed. Conductive layer 24 may be formed on lower circuit layers. Conductive layer 24 may, as an example, be formed on an underlying line 18 on device 10 or may be formed as part of line 18. Conductive layer 24 may be deposited on lower layer structures that include a substrate (e.g., a silicon wafer), layers that form underlying layers of nonvolatile memory elements (e.g., when the integrated circuit being formed is a stacked memory device), conductive layers such as lines 18 for routing, insulating layers for insulating conductive routing lines and nonvolatile memory elements from each other, or any other suitable layers of material.

Layer 24 may be formed from metal, metal nitrides, metal silicides, or other suitable conductive materials. Techniques that may be used to form layer 24 include physical vapor deposition (e.g., sputter deposition or evaporation), chemical vapor deposition, atomic layer deposition, and electrochemical deposition (e.g., electroless deposition or electroplating). If desired, more than one material may be used to form conductive layer 24. For example, conductive layer 24 may be formed from multiple sublayers of different materials or may be formed from a mixture of more than one element. The composition of layer 24 may also be altered using doping (e.g., by using ion implantation to add dopant to a metal or other material). The thickness of layer 24 may be in the range of 10-10000 angstroms (as an example). Layer 24 may serve as a lower electrode for device 12.

After the conductive layer of step 40 has been formed, one or more optional layers may be formed at step 42. These layers may, as an example, be used in forming electrical devices (current steering elements) such as device 38 of FIG. 2B. During step 42, one or more layers of semiconductor (e.g., doped and/or intrinsic silicon) may be formed and, if desired, one or more layers of conductor or other materials may be formed. If forming a diode such as diode 36 of FIG. 4, layers of n-type and p-type silicon may be deposited. The layers of step 42 may be deposited on conductive layer 24 using any suitable technique (e.g., physical vapor deposition, chemical vapor deposition, atomic layer deposition, or electrochemical deposition).

At step 44, metal oxide layer 22 may be deposited above the first conductive layer. If no optional layers were formed at step 42, the metal oxide layer may be deposited directly on the first conductive layer. If the optional layers of step 42 were deposited on the first conductive layer, metal oxide layer 22 may be formed on the optional layers, above the first conductive layer.

Metal oxide layer 22 may be formed of any suitable oxide. For example, metal oxide layer 22 may be formed from a transition metal such as titanium (i.e., to form titanium oxide). Dopants such as Al, Ni, Co, Zr, V, and Nb may be used in forming layer 22 (as examples). Dopants may be introduced in any suitable concentration (e.g., a concentration of 0-30%).

Metal oxide layer 22 may be deposited as a single layer of material or as multiple sublayers. In arrangements in which layer 22 is formed of multiple sublayers, each sublayer may be formed by a potentially distinct fabrication process using a potentially distinct set of materials. For example, different sublayers in metal oxide layer 22 may be formed at different deposition pressures, temperatures, and power levels (e.g., different sputtering powers when layer 22 is deposited using physical vapor deposition or PVD techniques). Different sublayers in metal oxide layer 22 may also be formed from different materials. For example, one sublayer may include dopant(s) and another sublayer may not include dopant(s). If desired, the concentrations of the materials in layer 22 (e.g., the base metal and/or the dopant(s)) may be varied continuously, so that one layer runs into the next without any abrupt interfaces.

Metal oxide layer 22 may be formed using any suitable fabrication technique. Examples of fabrication techniques that may be used in forming layer 22 include physical vapor deposition, chemical vapor deposition, atomic layer deposition, electrochemical deposition, followed by ion-implantation, annealing or other heat treatments such as oxidation, and combinations of these techniques. Oxidation techniques may include thermal oxidation in a furnace, oxidation in a rapid-thermal oxidation (RTO) tool, and ion implantation of oxygen ions followed by annealing.

It is desirable to be able to form highly resistive metal oxide films and to be able to tailor the resistances of such films for nonvolatile memory elements. Layer 22 is preferably formed with a highly resistive material. The resistance states of metal oxide layer 22 should preferably be significant as compared to that of the system (e.g. the memory device and associated circuitry) so that any change in the resistance state change is perceptible. This makes it difficult to integrate lower resistance metal oxide films into practical nonvolatile memory devices. For example, in a nonvolatile memory that has conductive lines formed of a relatively high resistance metal such as tungsten, the resistance of the conductive lines may overwhelm the resistance of the metal oxide resistive switching element. This may make is difficult or impossible to sense the state of the bistable metal oxide resistive switching element. Similar issues can arise from integration of the resistive switching memory element with current steering elements such as diodes and/or resistors. The resistance states of the resistive switching memory element are preferably significant compared to the resistance of the current steering elements so that any change in the resistance state of the resistive switching memory element can be detected reliably.

With one suitable arrangement, high resistivity may be obtained for layer 22 by depositing metal oxide layer 22 using sputtering techniques. A suitable sputtering (i.e. PVD) tool that may be used to deposit layer 22 can contain a radio-frequency (RF), direct current (DC) or pulsed-DC power supply to power the magnetron source (i.e., sputtering or PVD source).

It has been observed that high quality films with relatively high resistivities may be produced by sputter depositing the metal oxide layer 22 at a sputtering power density (proportional to the applied power divided by the eroded target area) of less than or equal to 6 W/cm$^2$, and more preferably at less than or equal to 4 W/cm$^2$. A sputter target may be used that is formed from the metal associated with the metal oxide (e.g., nickel), a mixture of the metal and one or more dopant metals (e.g., nickel and titanium), or other suitable substances (e.g., a metal oxide such as nickel oxide). More than one target may be used. Arrangements in which materials are sputtered from two or more targets simultaneously are generally referred to as co-sputtering arrangements. Metal oxide layer 22 may be deposited using co-sputtering or any other suitable sputtering technique.

In one embodiment, reactive sputtering at elevated deposition pressures is used to deposit metal oxide layer 22 with high resistivity. During sputter deposition operations, a gas mixture may be introduced into the magnetron that includes oxygen and at least one sputtering gas. The sputtering gas is ionized by the magnetron. Ionized sputtering gas impinges on the target and causes the target material to form a deposited film on the integrated circuit that is being fabricated. The oxygen in the sputtering gas mixture oxidizes the deposited material to form the metal oxide.

The sputtering gas may be, as an example, argon, xenon, krypton, or a combination of these gases. If desired, other gases that ionize and are able to sputter material from a target may be used. For at least some of the deposition process, the total gas pressure in the magnetron sputtering chamber is preferably greater than or equal to 10 mTorr, and more preferably greater than or equal to 20 mTorr (e.g. 40 mTorr or more, etc.). Sputtering at these elevated pressure regimes has the benefit of increasing the resistivity of the deposited metal oxide layer 22. In arrangements in which multiple sublayers of metal oxide are deposited, one sublayer may be deposited at a relatively high pressure (e.g., 20 mTorr or higher), whereas another sublayer may be deposited at a relatively lower pressure (e.g., 5 mTorr or less than 10 mTorr). The elevated pressure sputtering can be performed using DC sputtering, pulsed-DC sputtering, RF sputtering, and/or any combinations thereof.

In one embodiment, for reactive sputtering using a pulsed-DC power supply, higher metal oxide resistivities have been obtained by using a relatively low duty cycle for the power pulses applied to the sputtering source (e.g. magnetron). Suitable duty cycles may be less than or equal to 30%, more preferably less than or equal to 20% (e.g. less than or equal to 10%). Note that straight DC may also be used but may lead to arcing and/or nodule formation on the target, which can lead to process instability and/or particle formation, both deleterious to manufacturing implementation. A duty cycle of 30% means that a reverse pulse (e.g. non-sputtering pulse, typically a low positive pulse) is applied for 30% of the time.

The resistivity of deposited metal oxide films may also be further increased by thermal annealing. For example, the metal oxide films may be treated in a rapid thermal anneal (RTA) or rapid thermal oxidation (RTO) tool. This type of tool is able to ramp the temperature of a processed wafer up and down rapidly. In a typical scenario, a wafer is ramped up to a desired processing temperature in less than or equal to five minutes. Total processing times are typically greater than or equal to 30 seconds and less than 30 minutes, but may be longer. As an example, the deposited metal oxide film may be treated during step 44 using a rapid thermal anneal or rapid thermal oxidation process at a temperature of at least 300° C. in an ambient that contains oxygen. Exposing the deposited film to oxygen at an elevated temperature leads to thermal oxidation of the deposited metal oxide layer in order to increase the high-state and/or low-state resistivities of metal oxide layer 22. If desired, all or part of the oxidation may be performed by implanting oxygen ions into the deposited film followed by an anneal (e.g., in a vacuum ambient, a forming gas ambient, or an inert gas ambient) or by implantation of oxygen ions followed by a combined anneal and thermal oxidation operation. A furnace (e.g. vacuum or non-vacuum) furnace can also be used instead of a RTA or RTO tool.

Any suitable combination of the aforementioned processing techniques may be used to increase the resistivity of the deposited metal oxide layer 22. For example, the metal oxide may be deposited by sputtering using a gas mixture with a pressure of greater than or equal to 10 mTorr for at least a portion of the metal oxide layer 22, using pulsed-DC sputtering at a duty cycle of less than or equal to 30% at a sputtering power density of less than or equal to 6 W/cm$^2$.

Metal oxide films may be produced that have high-state resistivities of at least one ohm-cm, preferably at least 10 ohm-cm, or more preferably at least 100 ohm-cm. In addition, the ratio of the high-state resistance to the low-state resistance can be tailored to be greater than five or ten (as an example). It is generally desirable to have the ratio of the high-state resistance to the low-state resistance to be greater than or equal to ten and more preferably, greater than or equal to one hundred to facilitate clearly defined memory states.

Metal oxide layer 22 may be formed from a base metal oxide doped with at least one dopant. Metal oxide layer 22 may have particularly suitable high-resistivity characteristics when a dopant is used that has at least one oxidation state that is different than at least one oxidation state associated with the metal in the base metal oxide.

As an example, the base metal oxide may be titanium oxide and the dopant may be nickel or aluminum. Nickel and aluminum are suitable dopants because they each have at least one oxidation state that is different than at least one of the oxidation states associated with titanium oxide in the base oxide. Titanium in titanium oxide has associated oxidation states of +4 and +3. Nickel has common oxidation states of +2 and +3, so at least one of the nickel oxidation states (i.e., +2) is different than at least one of the titanium oxidation states (i.e., +4). Similarly, aluminum has an oxidation state of +3, which is different than the +4 titanium oxidation state.

In addition, the dopant(s) are chosen depending on the intrinsic conductivity type (e.g. n-type or p-type) of the base metal oxide. When the oxidation state of the dopant material is greater than the oxidation state of the metal in a p-type base metal oxide (e.g. Group IVB dopant elements in metal deficient nickel oxide, $Ni_{1-x}O$, where 0<x<1), there will be excess positive charge(s) relative to the base lattice. Negatively charged defect(s) (e.g. electrons) will be generated to maintain charge neutrality. These negatively charged defect(s) (e.g. electrons) can offset the majority hole carriers of the p-type base metal oxide to reduce the effective concentration of charged carriers, and hence reduce the conductivity (i.e. increase the resistivity) of the metal oxide film. Some examples of dopant elements for nickel oxide include Ti, Co, Zr, V, and Nb. These dopants possess at least one oxidation state that is different and greater than at least one oxidation state of nickel (+2 is generally most prevalent) in nickel oxide. On the other hand, when the oxidation state of the dopant material is less than the oxidation state of the metal in a n-type base metal oxide (e.g. Group IIIA dopant elements in oxygen deficient titanium oxide, $TiO_{2-x}$ where 0<x<1), there will be excess negative charge(s) relative to the base lattice. Positively charged defect(s) (e.g. holes) will be generated to maintain charge neutrality. These positively charged defect(s) (e.g. holes) can offset the majority electron carriers of the n-type base metal oxide to reduce the effective concentration of charged carriers, and hence reduce the conductivity (i.e. increase the resistivity) of the metal oxide film.

During the operations of step 44, the dopant is preferably added in a concentration that is below the solubility limit for the dopant in the base oxide. Typically, the dopant concentration is less than or equal to about 10% atomic concentration, but is not so limited depending on the materials system.

During the process of fabricating device 10, devices 12 are exposed to a range of processing temperatures. For example, device 10 may be exposed to processing temperatures of up to 700-900° C. (e.g., up to 800° C.) or other suitable maximum processing temperatures (e.g. for dopant activation of a diode connected in series with the resistive switching memory element). There is a solubility limit associated with the dopant in the base metal oxide at these processing temperatures. The metal oxide layer is preferably deposited so that the dopant is incorporated into the metal oxide layer at a concentration below this solubility limit.

In another embodiment, dopants are chosen so as to have an ionic radius that is close to the ionic radius of the metal in the base metal oxide. For example, a dopant may be selected for use during step 44 that has an ionic radius that is greater than or equal to 75% of the ionic radius of the metal in the base metal oxide and that is less than or equal to 150% of the ionic radius of the metal in the base metal oxide. More preferably, the dopant may be selected for use during step 44 that has an ionic radius that is greater than or equal to 85% of the ionic radius of the metal in the base metal oxide and that is less than or equal to 125% of the ionic radius of the metal in the base metal oxide.

The dopants can be introduced via sputtering (including reactive sputtering) of an alloy target (e.g. wherein the target contains both the base metal and the dopant specie(s) of interest) or via co-sputtering, wherein more than one target source material is used, and any other combinations thereof. In addition, the dopant can be introduced via deposition of multi-layers wherein at least one layer contains the dopant of interest, followed by an optional thermal anneal. The dopants can also be introduced via implantation. Note the doping of the base metal oxide can be combined with any of the aforementioned techniques (e.g. sputtering at elevated pressures, sputtering at low power densities, using low duty cycles for pulsed-DC sputtering, thermal treatment in an oxidizing environment, etc.) to further enhance the film resistivity of the metal oxide layer 22.

After forming metal oxide layer 22 at step 44, one or more optional layers may be formed on the metal oxide layer 22 at step 46. These layers may, as an example, be used to form electrical devices (current steering elements) such as devices 38 of FIG. 6. During step 46, one or more layers of semiconductor (e.g., doped and/or intrinsic silicon) may be formed and, if desired, one or more layers of conductor or other materials may be formed. If forming a diode, layers of n-type and p-type silicon may be deposited. The layers deposited during step 46 may be deposited on metal oxide layer 22 using any suitable technique (e.g., physical vapor deposition, chemical vapor deposition, atomic layer deposition, or electrochemical deposition).

At step 48, a second conductive layer may be formed. For example, a layer of conductive material such as conductor 20 of FIGS. 2A and 2B may be formed. If one or more of the optional layers of step 46 have been deposited, the second conductive layer may be deposited on the optional layers above the metal oxide layer 22 that was deposited at step 44. If none of the optional layers of step 46 have been deposited, the second conductive layer may be deposited above the metal oxide layer 22. The second conductive layer may serve as an upper electrode for device 12.

The second conductive layer may be formed from metal, metal nitrides, metal silicides, or other suitable conductive materials. Techniques that may be used to form the second conductive layer include physical vapor deposition (e.g., sputter deposition or evaporation), chemical vapor deposition, atomic layer deposition, and electrochemical deposition (e.g., electroless deposition or electroplating). If desired, more than one material may be used to form the second conductive layer. For example, conductive layer 20 may be formed from multiple sublayers of different materials as shown in FIG. 2B or may be formed from a mixture of more than one element. The thickness of layer 20 may be in the range of 10-10000 angstroms (as an example).

If desired, optional layers of the type deposited during step 46 (e.g., current steering elements such as a diode) may be formed after step 48 as well. For example, such optional layers may be formed on top of the second conductive layer that is formed during step 48 (e.g., in addition to or instead of forming the optional layers during step 46).

Resistive switching metal oxide films have been sputter deposited using a pulsed DC magnetron sputtering tool. Experimental results are shown in FIGS. 8-15.

In the experiments of FIGS. 8-15, the target diameter was 3 inches, so a sputtering power of 300 W corresponds to a sputtering power density of about 6.6 W/cm$^2$, a sputtering power of 150 W corresponds to a sputtering power density of 3.3 W/cm$^2$, and a sputtering power of 100 W corresponds to a sputtering power density of 2.2 W/cm$^2$. The effect of changes in sputtering power on the measured resistivity of a nickel oxide film are shown in FIG. 8. The films of FIG. 8 were deposited using a 5 mTorr total gas mixture pressure, a 37.5% oxygen concentration in a gas mixture containing oxygen and argon, and pulsed DC pulses at a 150 kHz pulse rate. The duty cycle of the sputtering pulses, which is equal to the ratio of the off time (or low power time) of each DC sputtering pulse to its period (i.e., 2000 ns/6666 ns), was 30%. As shown in FIG. 8, use of a sputtering power of 150 W results in a higher resistivity film than use of a sputtering power of 300 W. Reducing the sputtering power to 100 W from 150 W further enhances the resistivity of the metal oxide film.

The effect of duty cycle on measured resistivity for deposited nickel oxide films is shown in the table of FIG. 9. The depositions of FIG. 9 were carried out using a 300 W sputtering power, a 150 kHz pulsed DC sputtering signal, a 300° C. substrate temperature, and an oxygen and argon gas mixture having a total pressure of 5 mTorr and an oxygen concentration of 47.4%. As shown in the table of FIG. 9, the resistivity of each deposited film increases as the duty cycle of the sputtering signal is reduced. Sputtering power pulses with a 15% duty cycle exhibit a higher resistivity than sputtering power pulses having a 20% duty cycle. Film resistivity can be further enhanced using duty cycles of 10% or less. A duty cycle of 0 represents a sputtering signal that is purely DC. In other experiments, the use of higher duty cycles (e.g., duty cycles of 20%-40%) were investigated. In general, a trend towards increasing resistivities at lower duty cycles was measured. For example, use of a duty cycle of 30% was observed to produce a lower resistivity than use of a 20% duty cycle and a higher resistivity than use of a 40% duty cycle.

FIG. 10 is a table showing the effect of performing rapid thermal oxidation operations on deposited resistive switching nickel oxide films. During oxidation, each sample in the table of FIG. 10 was subjected to a rapid thermal oxidation lasting about 60 seconds (plus a 15-30 second temperature ramp-up period and a 15-30 second temperature ramp-down period). The temperature (i.e., the maximum or plateau temperature) of the 60 second RTO process was 550° C. The sputtering gas mixture contained oxygen and argon and had a 9 liter/minute oxygen flow rate.

Each row in the table of FIG. 10 corresponds to a different set of deposition conditions. As shown under the column labeled "process" in the first row of the FIG. 10 table, for example, sample number 1 was deposited using a sputtering power of 300 W, a pulsed DC sputtering power signal, a 20 second sputtering duration, a 5 mTorr gas pressure in a gas mixture of oxygen and argon, a 38% oxygen concentration, and a 300° C. substrate temperature.

The measured sheet resistance of each film is listed in the column of the FIG. 10 table that is labeled "Rs." There are two entries in each row, the first of which corresponds to the measured sheet resistance of the metal oxide film before the rapid thermal oxidation process was performed and the second of which corresponds to the measured sheet resistance of the metal oxide film after the rapid thermal oxidation process was performed. For example, in the first row, the measured sheet resistance of the nickel oxide film is 59.4 ohms/square. Following rapid thermal oxidation, the measured sheet resistance of the nickel oxide film was "off limit" because the upper limit of the sheet resistance measurement tool was exceeded. The rapid thermal oxidation process therefore increased the resistivity of the deposited metal oxide film.

As the table of FIG. 10 demonstrates, each of the deposited metal films exhibited an increase in sheet resistance when oxidized using a rapid thermal oxidation process. (The sheet resistance of sample four was too high to measure both before and after RTO treatment.)

Figure 11:
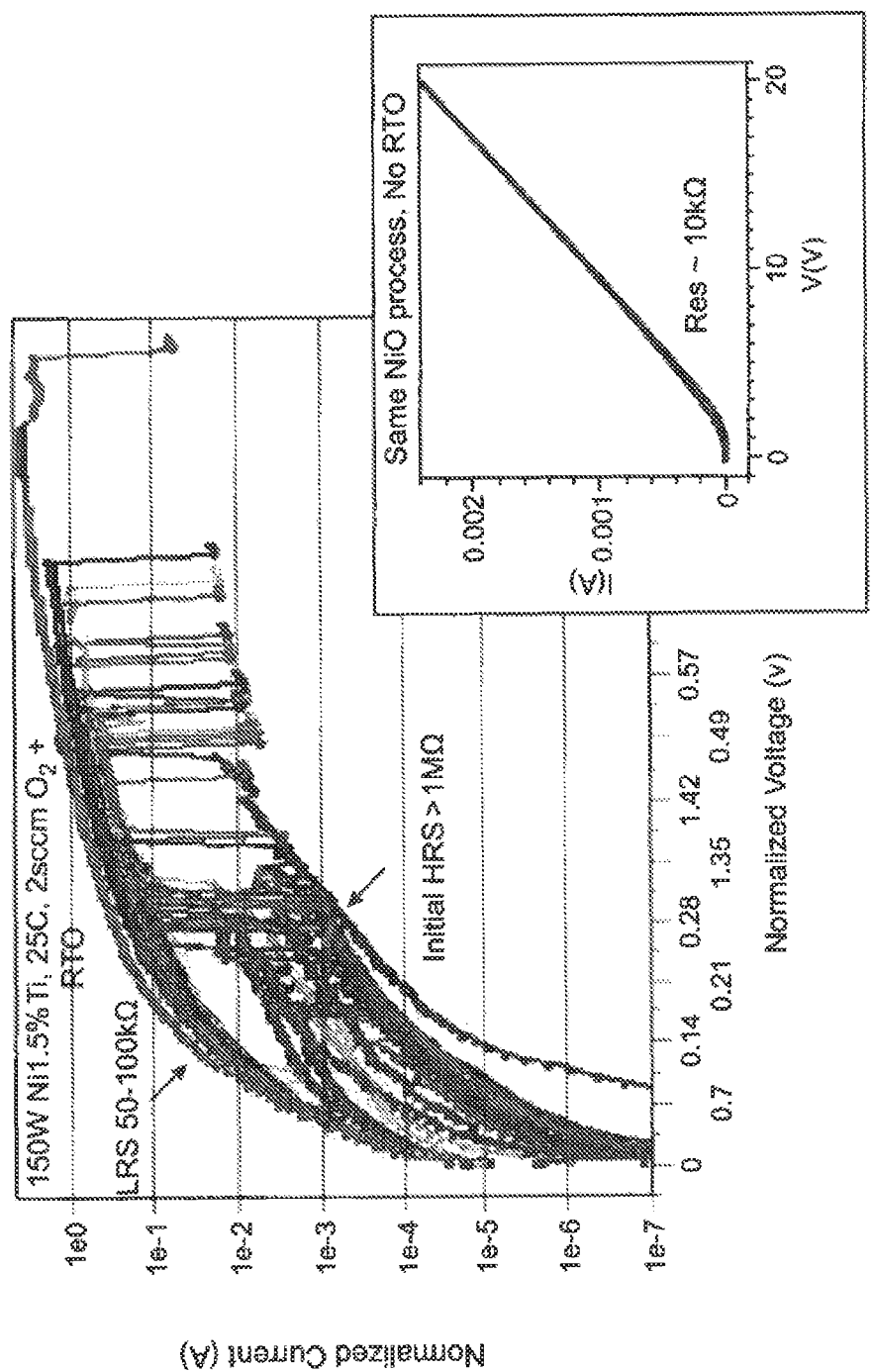
FIG. 11 is a graph showing the effect of performing a rapid thermal oxidation on a resistive switching memory element in accordance with an embodiment of the present invention.

The graph of FIG. 11 further illustrates the effect of performing a rapid thermal oxidation on a resistive switching metal oxide film. As shown in the graph of FIG. 11, the metal oxide film switches between a low resistance state (LRS) having an associated resistance of 50-100 kΩ and a high resistance state (HRS) having an associated resistance of greater than one MΩ.

In the example of FIG. 11, a nickel oxide film was tested. The nickel oxide film was doped with a 1.5% atomic concentration of titanium. The film was deposited using a 150 kHz pulsed DC sputtering signal having a 150 W sputtering power and a 30% duty cycle, a 25° C. substrate temperature, and a 2 sccm flow of oxygen in a gas mixture of oxygen and argon. Prior to rapid thermal oxidation, the nickel oxide film exhibited a resistance of about 10 kΩ, as shown in the inset to FIG. 11. No resistive switching was observed prior to rapid thermal oxidation. After performing the rapid thermal oxidation, the resistive switching oxide exhibits bistability and a substantially increased HRS resistance (i.e., 1 MΩ).

The table of FIG. 12 shows how doped resistive switching metal oxides may exhibit enhanced resistivities relative to undoped resistive switching metal oxides. The table of FIG. 12 has two columns. The first column lists various metal oxide film compositions (e.g., nickel oxide, nickel oxide doped with 3% atomic concentration of titanium, nickel oxide doped with 3% atomic concentration of cobalt, etc.). The second column lists measured resistivities. As shown in the second column, the measured resistivity of the doped metal oxide films are all greater than the measured resistivity of the undoped nickel oxide film.

It may be desirable to heat the substrate (e.g., the silicon wafer) upon which a metal oxide film is being deposited. Substrate heating may serve as a form of annealing that may help to reduce carrier-producing defects and thereby increase film resistivity. In general, any suitable substrate temperatures may be used (e.g., greater than or equal to 100° C., greater than or equal to 300° C., greater than 500° C., etc.). As shown in FIG. 13, use of higher substrate temperatures (e.g., 300° C.) tends to increase film resistivity.

If desired, metal oxide films for resistive switching elements may be deposited as one or more sublayers. For example, a thin highly resistive sublayer may be added to a thicker metal oxide layer to enhance the resistivity of the metal oxide. The use of a metal oxide film that contains a thin highly resistive layer rather than a single layer may make it easier to achieve a given film resistivity with a desired film stability. The effect of forming the metal oxide layer from two sublayers has been investigated for titanium oxide (nominally $TiO_2$) films. A 250 angstrom single-layer titanium oxide film was deposited using a 5 mTorr gas pressure. For comparison, a bilayer titanium oxide film was deposited that contained a 250 angstrom layer formed using a 5 mTorr gas pressure and a 5 angstrom high-resistance layer formed using a 50 mTorr gas pressure.

The resistance of these two layers was compared by measuring the mean current passed by each layer in its high resistance state at an applied voltage of 0.5 volts. The single layer of titanium oxide exhibited a mean current of 411 nA, whereas the bilayer of titanium oxide exhibited a mean current of 360 nA. Although the bilayer was 5 angstroms (2%) thicker than the single layer, the bilayer exhibited an increase in resistance of over 10%, indicating that the presence of the high-resistance layer was helpful in increasing resistance without substantially increasing film thickness.

The effects of different gas mixture pressures were investigated by depositing nickel oxide films with a 150 W sputtering power, a 150 kHz pulsed DC sputtering signal, and a 300° C. substrate temperature for a variety of oxygen concentrations in a gas mixture of oxygen and argon. Experimental results are shown in FIGS. 14 and 15. In the table of FIG. 14, measured metal oxide film resistivities are plotted as a function of oxygen concentration for total gas pressures of 5 mTorr and 20 mTorr. In the table of FIG. 15, measured metal oxide film resistivities are plotted as a function of oxygen concentration for gas mixture pressures of 5 mTorr and 40 mTorr. As shown in these tables, film resistivity increased with increasing gas pressure for all values of oxygen concentration. In other experiments, other gas pressures were investigated. In general, better results (higher film resistivities) were achieved when using elevated gas pressures. For example, the film resistivities that were measured using a 10 mTorr gas pressure were higher than those measured using a 5 mTorr gas pressure, the film resistivities that were measured using a 20 mTorr gas pressure were higher than those measured using a 10 mTorr gas pressure, and the film resistivities that were measured using a 40 mTorr gas pressure were higher than those measured using a 20 mTorr gas pressure.

The foregoing is merely illustrative of the principles of this invention and various modifications can be made by those skilled in the art without departing from the scope and spirit of the invention.

What is claimed is:

1. A method for forming a resistive switching nonvolatile memory element comprising:
   forming a first conductive layer;
   sputter depositing a layer that contains a base metal oxide formed from a metal and that contains at least one dopant, wherein at least one oxidation state associated with the dopant is different than at least one oxidation state of the metal in the base metal oxide; and
   forming a second conductive layer.

2. The method defined in claim 1 wherein the base metal oxide is n-type and wherein the at least one oxidation state associated with the dopant is less than the at least one oxidation state associated with the metal in the base metal oxide.

3. The method defined in claim 1 wherein the base metal oxide is p-type and wherein the at least one oxidation state associated with the dopant is greater than the at least one oxidation state associated with the metal in the base metal oxide.

4. The method defined in claim 1 wherein the base metal oxide comprises nickel oxide and wherein the dopant comprises a material selected from the group consisting of: Ti, Co, Zr, V, and Nb.

5. The method defined in claim 1 wherein depositing the metal oxide layer comprises sputter depositing the metal oxide layer with an atomic concentration of the dopant of less than 10%.

6. The method defined in claim 1 wherein there is a solubility limit associated with the dopant in the base metal oxide and wherein depositing the metal oxide layer comprises depositing the metal oxide layer so that the dopant is incorporated into the metal oxide layer at a concentration below the solubility limit.

7. The method defined in claim 1 wherein there is an ionic radius associated with the metal in the base metal oxide and wherein the dopant has an ionic radius that is greater than or equal to 75% of the ionic radius of the metal in the base metal oxide and that is less than or equal to 150% of the ionic radius of the metal in the base metal oxide.

8. The method defined in claim 1 wherein depositing the metal oxide layer comprises sputter depositing the metal oxide layer in a gas mixture that includes oxygen and at least one sputtering gas and wherein the gas mixture has a pressure greater than or equal to 10 mTorr.

9. The method defined in claim 1 further comprising annealing the deposited metal oxide layer at a temperature of at least 300° C. for at least thirty seconds in an oxygen ambient.

10. The method defined in claim 1 wherein depositing the metal oxide layer comprises sputter depositing the metal oxide layer at a sputtering power density of less than or equal to 6 $W/cm^2$.

* * * * *